United States Patent
Liu

(10) Patent No.: US 9,531,367 B2
(45) Date of Patent: Dec. 27, 2016

(54) PULSE WIDTH MODULATION SIGNAL GENERATION CIRCUIT AND METHOD

(71) Applicant: Nuvoton Technology Corporation, Hsinchu (TW)

(72) Inventor: Ming-Ying Liu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 14/960,425

(22) Filed: Dec. 6, 2015

(65) Prior Publication Data

US 2016/0204774 A1    Jul. 14, 2016

(30) Foreign Application Priority Data

Jan. 14, 2015   (TW) .............................. 104101192 A

(51) Int. Cl.
  H03L 7/00  (2006.01)
  H03K 7/08  (2006.01)
  H03K 21/02  (2006.01)

(52) U.S. Cl.
  CPC .............. *H03K 7/08* (2013.01); *H03K 21/023* (2013.01)

(58) Field of Classification Search
  USPC .................................................. 327/160, 172
  See application file for complete search history.

(56) References Cited

U.S. PATENT DOCUMENTS

| 6,330,170 B1* | 12/2001 | Wang | ....................... H02J 9/062 363/17 |
|---|---|---|---|
| 7,953,145 B2 | 5/2011 | Matsushima | |
| 8,198,925 B1 | 6/2012 | Wang | |
| 8,416,589 B2* | 4/2013 | Portisch | ............ H02M 3/33523 363/21.15 |
| 8,525,609 B1* | 9/2013 | Sadasivam | ............... H03K 7/08 327/172 |
| 8,558,497 B2* | 10/2013 | Wright | ..................... H03K 7/08 318/34 |
| 8,731,042 B2 | 5/2014 | Martin | |

(Continued)

FOREIGN PATENT DOCUMENTS

CN           102324891           4/2013

OTHER PUBLICATIONS

"Office Action of Taiwan Counterpart Application", issued on Apr. 25, 2016, p. 1-p. 3.

*Primary Examiner* — Adam Houston
(74) *Attorney, Agent, or Firm* — Jianq Chyun IP Office

(57) ABSTRACT

A pulse width modulation signal generation circuit and a pulse width modulation signal generation method are provided. A clock generator is configured for generating a clock signal including a plurality of pulses. The counting unit is coupled to the clock generator, and configured for storing a period parameter and outputting a counting value by counting the pulses of the clock signal based on the period parameter and a bidirectional counting mode. The comparing unit is coupled to the counting unit and is configured for comparing the counting value and a comparing threshold to output a level control signal. The signal generating unit is coupled to the comparing unit and configured for generating a pulse width modulation signal according to the level control signal. When the period parameter is odd, the counting value outputted by the counting unit is equal to a middle value in the two continuous clock cycles.

20 Claims, 5 Drawing Sheets

(56) References Cited

U.S. PATENT DOCUMENTS

| | | | |
|---|---|---|---|
| 2004/0146101 A1* | 7/2004 | Pearce | H02M 3/157 |
| | | | 375/238 |
| 2006/0164142 A1* | 7/2006 | Stanley | H03K 7/08 |
| | | | 327/172 |
| 2007/0230559 A1 | 10/2007 | Kris et al. | |
| 2009/0160553 A1* | 6/2009 | Wei | H03F 3/2173 |
| | | | 330/251 |
| 2012/0200229 A1* | 8/2012 | Kunst | H05B 33/0815 |
| | | | 315/186 |
| 2012/0269015 A1* | 10/2012 | Bringivijayaraghavan | G11C 7/109 |
| | | | 365/194 |
| 2016/0173078 A1* | 6/2016 | Shih | H03K 7/08 |
| | | | 327/172 |
| 2016/0204774 A1* | 7/2016 | Liu | H03K 21/023 |
| | | | 327/160 |

\* cited by examiner

PULSE WIDTH MODULATION SIGNAL GENERATION CIRCUIT AND METHOD

CROSS-REFERENCE TO RELATED APPLICATION

This application claims the priority benefit of Taiwan application serial no. 104101192, filed on Jan. 14, 2015. The entirety of the above-mentioned patent application is hereby incorporated by reference herein and made a part of this specification.

BACKGROUND OF THE DISCLOSURE

1. Field of the Disclosure

The disclosure relates to a pulse width modulation signal generation circuit and method, and particularly relates to a pulse width modulation signal generation circuit and method using a bidirectional counting mode.

2. Description of Related Art

Pulse width modulation (PWM) has been broadly applied in electronic circuits, such as motor control circuits and power supplies. Counter-based pulse width modulation signal generation devices can be categorized into edge-aligned mode and center-aligned mode. Compared with the asymmetrical edge-aligned mode, currents and voltages output by the center-aligned mode with a symmetrical framework have fewer harmonics. Thus, a pulse-width modulation system using the center-aligned mode may reduce power consumption.

However, under the premise that the clock frequency is fixed, the resolution of the pulse width modulation signal may be limited by the characteristic of symmetry of the center-aligned mode. Besides, if the clock frequency is increased to improve the resolution of pulse width modulation in the center-aligned mode, the overall circuit framework needs to be significantly modified, and the dynamic power consumption may also be higher. Besides, there may also be interference of noises.

SUMMARY

Thus, the embodiments of the disclosure provides a pulse width modulation signal generation circuit and method capable of increasing a resolution of a pulse width modulation signal even if a clock frequency is fixed.

An embodiment of the disclosure provides a pulse width modulation signal generation circuit including a clock generator, a counting unit, a comparing unit, and a signal generating unit. The clock generator generates a clock signal including a plurality of pulses. The counting unit is coupled to the clock generator, stores a period parameter, and counts the pulses of the clock signal based on the period parameter and a bidirectional counting mode to output a counting value. The comparing unit is coupled to the counting unit and compares the counting value and a comparing threshold to output a level control signal accordingly. The signal generating unit is coupled to the comparing unit and generates a pulse width modulation signal based on the level control signal. When the period parameter is an odd number, the counting value output by the counting unit is a middle value in two consecutive clock cycles.

An embodiment of the disclosure provides a pulse width modulation signal generation method that includes following steps. A period parameter and a comparing threshold are provided, and a clock signal including a plurality of pulses is received. Pulses of the clock signal are counted based on the period parameter and a bidirectional counting mode, so as to output a counting value. Whether the period parameter is an odd number or an even number is determined. When the period parameter is an odd number and the counting value is increased to a middle value, the counting value equal to the middle value is output in two consecutive clock cycles. The counting value and the comparing threshold are compared to determine an output level of the pulse width modulation signal, and the pulse width modulation signal is output.

An embodiment of the disclosure provides a pulse width modulation signal generation circuit including a clock generator, a counting unit, a comparing unit, and a signal generating unit. The clock generator generates a clock signal including a plurality of pulses. The counting unit is coupled to the clock generator and stores a period parameter. The counting unit counts the pulses of the clock signal based on the period parameter to output a counting value. The comparing unit is coupled to the counting unit and compares the counting value and a comparing threshold to output a level control signal accordingly. The signal generating unit is coupled to the comparing unit and generates a pulse width modulation signal based on the level control signal. The period parameter is set as the number of pulses of the clock signal in a signal cycle of the pulse width modulation signal.

To make the above features and advantages of the disclosure more comprehensible, embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
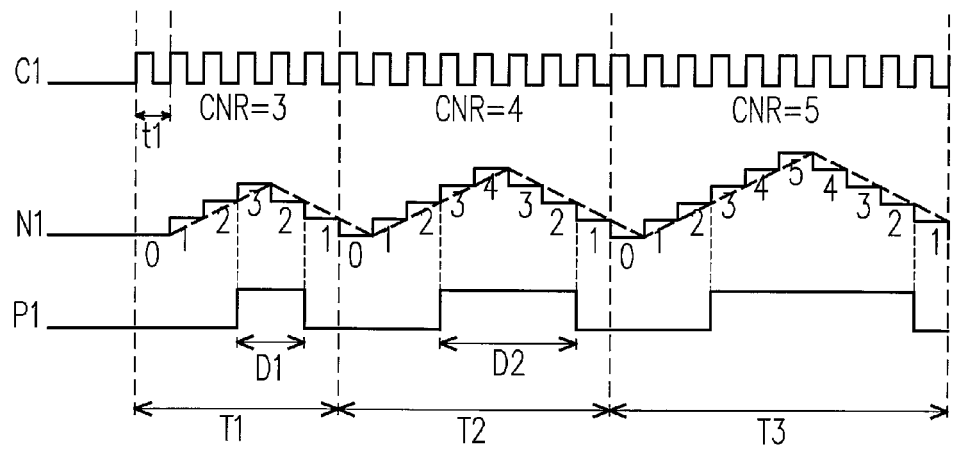
FIG. 1 is a schematic view illustrating a sequence of signals of a pulse width modulation signal generation circuit.

Reference will now be made in detail to the present preferred embodiments of the disclosure, examples of which are illustrated in the accompanying drawings. Wherever possible, the same reference numbers are used in the drawings and the description to refer to the same or like parts.

The term "coupling" throughout the specification of the disclosure (including claims) may refer to any direct or indirect means of connection. For example, if it is described in the disclosure that a first device is coupled to a second device, it should be understood that the first device may be directly connected to the second device, or the first device may be indirectly connected to the second device through another device or a certain connection means. Moreover, wherever possible, elements/components/steps with same reference numerals represent same or similar parts in the drawings and embodiments. Elements/components/steps described with the same numerals or terms in different embodiments may be referred to each other.

FIG. 1 is a schematic view illustrating a sequence of signals of a pulse width modulation signal generation circuit. Referring to FIG. 1, when a period parameter CNR is equal to 3 (CNR=3), a counter of the pulse width modulation signal generation circuit in a center-aligned mode counts up in response to a clock signal Cl in a signal cycle T1, and outputs an increasing counting value N1. As shown in FIG. 1, when the period parameter is equal to 3, the counting value N1 gradually increases from 0 to 3. When the counting value N1 is equal to 3, the counter of the pulse width modulation signal generation circuit in the center-aligned mode starts to count down and outputs the decreasing counting value N1. As shown in FIG. 1, the counting value N1 gradually decreases from 3 to 0. It can be seen that a length of a signal cycle T1 is equal to six clock cycles t1.

Also, the pulse width modulation signal generation circuit may compare the counting value with a comparing threshold to determine an output level of a pulse width modulation signal P1. As shown in FIG. 1, it is assumed that the comparing threshold is 2. Whenever the counter outputs the counting value N1 equal to 2, the output level of the pulse width modulation signal P1 is trigged to switch from a high level to a low level or from the low level to the high level. Thus, the pulse width modulation signal P1 is at the high level in an enabled period D1, and the enabled period D1 lasts for two clock cycles t1. Based on the same assumption and working principle, when the period parameter CNR is equal to 4, a length of a signal cycle T2 is equal to eight clock cycles t1, and an enabled period D2 of the pulse width modulation signal P1 lasts for four clock cycles t1. When the period parameter CNR is equal to 5, a length of a signal cycle T3 is equal to ten clock cycles t1.

In other words, due to a characteristic of symmetry of the center-aligned mode, whenever the clock cycle CNR in a counting register increases by 1, the signal cycle of the pulse width modulation signal correspondingly increases by two clock cycles. Also, a duration that the pulse width modulation signal is at the high/low level within one signal cycle also shows an increase or decrease by a unit of two clock cycles. Thus, a resolution of the pulse width modulation signal is limited by the characteristic of symmetry of the center-aligned mode. Accordingly, the embodiments of the disclosure provides a pulse width signal generation circuit using the bidirectional counting mode, just like the center-aligned mode, but is capable of further improving the resolution of the pulse width modulation signal.

Figure 2:
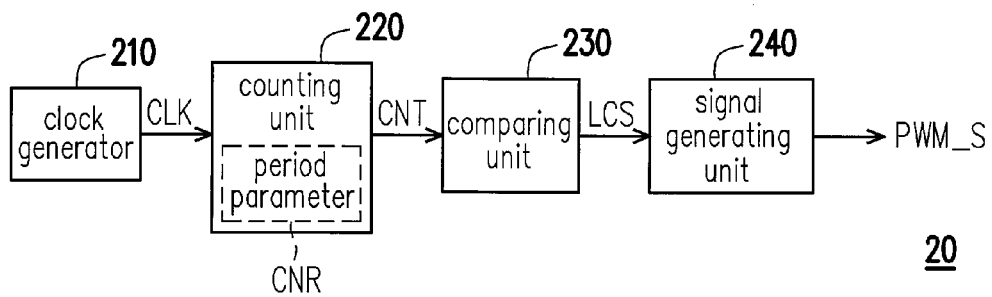
FIG. 2 is a block diagram illustrating a pulse width modulation signal generation circuit according to an embodiment of the disclosure.

FIG. 2 is a block diagram illustrating a pulse width modulation signal generation circuit according to an embodiment of the disclosure. Referring to FIG. 2, a pulse width modulation signal generation circuit 20 may generate a pulse width modulation signal PWM_S, and the pulse width modulation signal generation circuit 20 may include a clock generator 210, a counting unit 220, a comparing unit 230, and a signal generating unit 240. The clock generator 210 may generate a clock signal CLK having a plurality of pulses, and a clock cycle of the clock signal CLK may be determined according to a clock frequency thereof. For example, the clock frequency of the clock signal CLK may be 12 MHz, and a length of the clock cycle of the clock signal CLK may be a reciprocal of the clock frequency. However, the disclosure is not limited thereto.

The counting unit 220 may be coupled to a clock generator 210 to receive the clock signal CLK and store a period parameter CNR. In the embodiments of the disclosure, the period parameter CNR may be set as the number of pulses of the clock signal CLK in a signal cycle of the pulse width modulation signal PWM_S. In other words, the period parameter CNR may determine the signal cycle of the pulse width modulation signal PWM_S. For example, when the period parameter CNR is 7, the clock generator 210 may generate seven pulses within one signal cycle of the pulse width modulation signal PWM_S. Namely, a length of the signal cycle of the pulse width modulation signal PWM_S is equal to seven times of the length of the clock cycle.

The counting unit 220 may output a counting value CNT by counting the pulses of the clock signal CLK based on the period parameter CNR and the bidirectional counting mode. The bidirectional counting mode is a mode that first counts up and then counts down within one signal cycle. More specifically, when the counting unit 220 uses the bidirectional counting mode to count the pulses of the clock signal CLK, the counting unit 220 may count up and then count down within one single signal cycle in response to the pulses of the clock signal CLK. In other words, the counting unit 220 adopts the bidirectional counting mode similar to counting manner of the center-aligned mode. Specifically, within one signal cycle, the counting unit 220 may firstly counts up with respect to the pulses of the clock signal CLK, and outputs the increasing counting value CNT, until the counting value CNT becomes equal to a middle value. The middle value is a maximal value of the counting value. Then, the counting unit 220 may count down with respect to the pulses of the clock signal CLK, so as to output the decreasing counting value CNT. In the embodiments of the disclosure, as shown in Formula (1), the middle value is a maximal positive integer not greater than an outcome of the period parameter CNR divided by two.

$$MiddleValue = \left\lfloor \frac{PeriodParameter}{2} \right\rfloor \quad \text{Formula (1)}$$

wherein $\lfloor \ \rfloor$ is a Gaussian symbol.

The comparing unit 230 may be coupled to the counting unit 220 to receive the counting value CNT. Generally speaking, the comparing unit 230 has a register for storing the comparing threshold. In addition, the comparing threshold is an integer smaller than or equal to the middle value. The comparing unit 230 may compare the counting value CNT and the comparing threshold to output a level control signal LCS accordingly. The signal generating unit 240 may be coupled to the comparing unit 230 to receive the level control signal LCS and generate the pulse width modulation signal PWM_ S based on the level control signal LCS. In other words, the signal generating unit 240 may determine an output level of the pulse width modulation signal PWM_S according to a comparison result of the counting value CNT and the comparing threshold.

The counting unit 220 in the embodiments of the disclosure may determine whether to extend a duration for outputting the middle value based on whether the period parameter CNR is odd or even. Specifically, when the period parameter CNR is an odd number and the counting unit 220 counts up to the middle value, the counting value CNT output by the counting unit 220 is the middle value within two consecutive clock cycles. In other words, the counting unit 220 may firstly count up in response to the clock signal CLK and output the sequentially increasing counting value CNT, and keep outputting the middle value for two clock cycles, and then count down to output the sequentially decreasing counting value CNT. Alternatively, when the period parameter CNR is an even number, and the counting unit 220 counts to the middle value, the counting value output by the counting unit is the middle value within one single clock cycle. Accordingly, the signal cycle and an enabled period of the pulse width modulation signal PWM_S in the embodiments of the disclosure may be determined based on the period parameter CNR and the comparing threshold. In addition, when the period parameter CNR increases by 1, the signal cycle or enabled period of the pulse width modulation signal PWM_S generated by the pulse width modulation signal generation circuit 20 may add one additional clock cycle only. Thus, the signal cycle or enabled period of the pulse width modulation signal generation circuit 20 is no longer limited by the increasing mode with two clock cycles as the basic unit.

Figure 3:
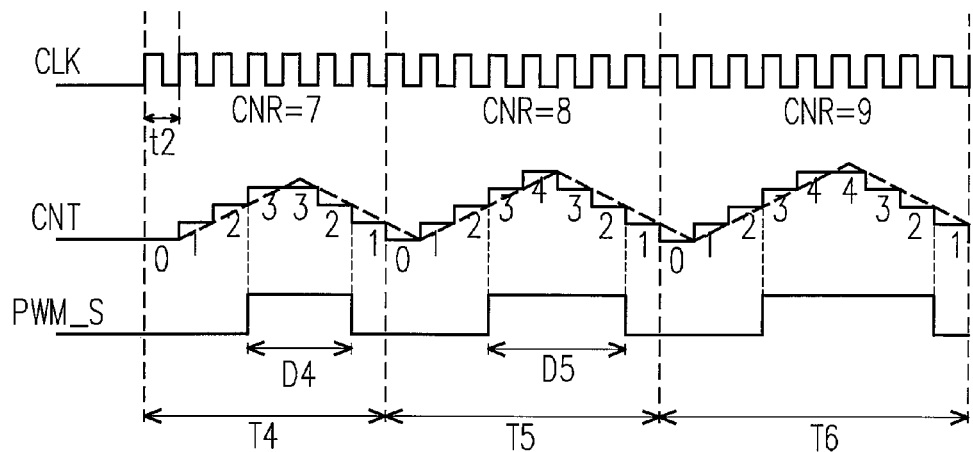
FIG. 3 is a schematic view illustrating a sequence of signals of a pulse width modulation signal generation circuit according to an embodiment of the disclosure.

Thus, to clearly describe an operating principle of the pulse width modulation signal generation circuit 20, FIG. 3, which is a schematic view illustrating a sequence of signals of a pulse width modulation signal generation circuit according to an embodiment of the disclosure, is provided. Referring to FIGS. 2 and 3 together, it should be noted herein that in the illustration of FIG. 3, it is assumed that the comparing threshold is 2. However, the disclosure is not limited thereto. The clock generator 210 may output the clock signal CLK to the counting unit 220, making the counting unit 220 start counting. Assuming that the period parameter CNR is equal to 7, a signal cycle T4 of the pulse width modulation signal PWM_S is equal to seven clock cycles t2, and the middle value is "3". Accordingly, the counting unit 220 counts up with respect to the pulses of the clock signal CLK to output the increasing counting value CNT. As shown in FIG. 3, when CNR is equal to 7, the counting value CNT output by the counting unit 220 gradually increases from "0" to the middle value "3".

Since the period parameter CNR is an odd number (CNR=7), the counting value CNT output by the counting unit 220 is the middle value "3" in two consecutive clock cycles. In other words, the counting unit 220 firstly keeps outputting the counting value CNT equal to the middle value '3' for one clock cycle t2. Then, instead of counting down, the counting unit 220 further outputs the counting value equal to the middle value "3". In other words, the counting unit 220 starts to counting down to output the decreasing counting value after outputting the counting value CNT equal to the middle value "3" in two consecutive clock cycles t2. As shown in FIG. 3, when CNR is equal to 7, the counting value CNT gradually decreases from the middle value "3" to "0".

Furthermore, since the comparing threshold is equal to 2, when CNR is equal to 7, the pulse width modulation signal generation circuit 20 outputs the pulse width modulation signal PWM_S at a second level in a second level period D4, and outputs the pulse width modulation signal PWM_S at a first level during remaining time in the signal cycle T4. The second level period D4 may last for three clock cycles t2. In addition, the first level is different from the second level. In the embodiment shown in FIG. 3, the first level is the low level and the second level is the high level. However, the disclosure is not limited thereto. In another embodiment, the first level may be the high level and the second level may be the low level. In the embodiments of the disclosure, a period that the pulse width modulation signal PWM_S is kept at the high level within one signal cycle is the enable period, and a period that the pulse width modulation signal PWM_S is kept at the low level within one signal cycle is a disabled period. Specifically, in the example shown in FIG. 3, the second level period D4 and a second level period D5 are the enabled periods.

Referring to FIG. 3 again, similar, assuming that the period parameter CNR is equal to 8, a signal cycle T5 of the pulse width modulation signal PWM_S is equal to eight clock cycles t2 and the middle value is "4". Accordingly, the counting unit 220 counts up with respect to the pulses of the clock signal CLK to output the increasing counting value CNT. As shown in FIG. 3, when CNR is equal to 8, the counting value CNT gradually increases from "0" to the middle value "4".

Since the period parameter CNR is an even number (CNR=8), the counting value CNT output by the counting unit 220 is the middle value "4" only for one single clock cycle. In other words, after keeping the counting value CNT at the middle value "4" for one clock cycle t2, the counting unit 220 starts counting down to output the gradually decreasing counting value. As shown in FIG. 3, when CNR is equal to 8, the counting value CNT gradually decreases from the middle value "4" to "0". Furthermore, since the comparing threshold is equal to 2, when CNR is equal to 8, the pulse width modulation signal generation circuit 20 outputs the pulse width modulation signal PWM_S at the second level in the second level period D5, and outputs the pulse width modulation signal PWM_S at the first level during remaining time in the signal cycle T5. The second level period D5 may last for four clock cycles t2.

By comparing the example where CNR is equal to 7 and the example where CNR is equal to 8, it can be known that when the parameter period CNR increases by 1, the signal cycle and the enabled period of the pulse width modulation signal PWM_S only increase by one clock cycle respectively. Specifically, the signal cycle T5 has one more clock cycle than the signal cycle T4, and the second level period D5 has one more clock cycle than the second level period D4. Similarly, assuming that the period parameter CNR is equal to 9, a signal cycle T6 of the pulse width modulation signal PWM_S is equal to nine clock cycles t2, and the middle value is "4". As shown in FIG. 3, when CNR is equal to 9, the counting value CNT gradually increases from "0" to the middle value "4". Since the period parameter CNR is an odd number (CNR=9), the counting value CNT output by the counting unit 220 is the middle value "4" in two consecutive clock cycles t2. Based on the above, since the counting unit 220 may adopts different ways of counting based on whether the period parameter CNR is odd or even, the signal cycle or enabled period of the pulse width modulation signal generation circuit 20 according to the embodiments of the disclosure is no longer limited by the increasing mode with two clock cycles as the basic unit, such that the resolution of the pulse width modulation may be increasing.

It should also be noted that although the disclosure is described with the examples where CNR is equal to 7, 8, and 9, respectively, the disclosure is not limited thereto. People having ordinary skills in the art may refer to the description in the above embodiments and infer the embodiments whose period parameters are equal to other values accordingly. Thus, details in this respect are not repeated in the following. In other words, the scope of the disclosure applies as long as the counting unit determines whether to output the middle value in two consecutive clock cycles, for example, based on whether the period parameter is odd or even, such that the signal cycle or the enabled period of the pulse width modulation signal is no longer limited by the increasing mode with two clock cycles as the basic unit.

Figure 4:
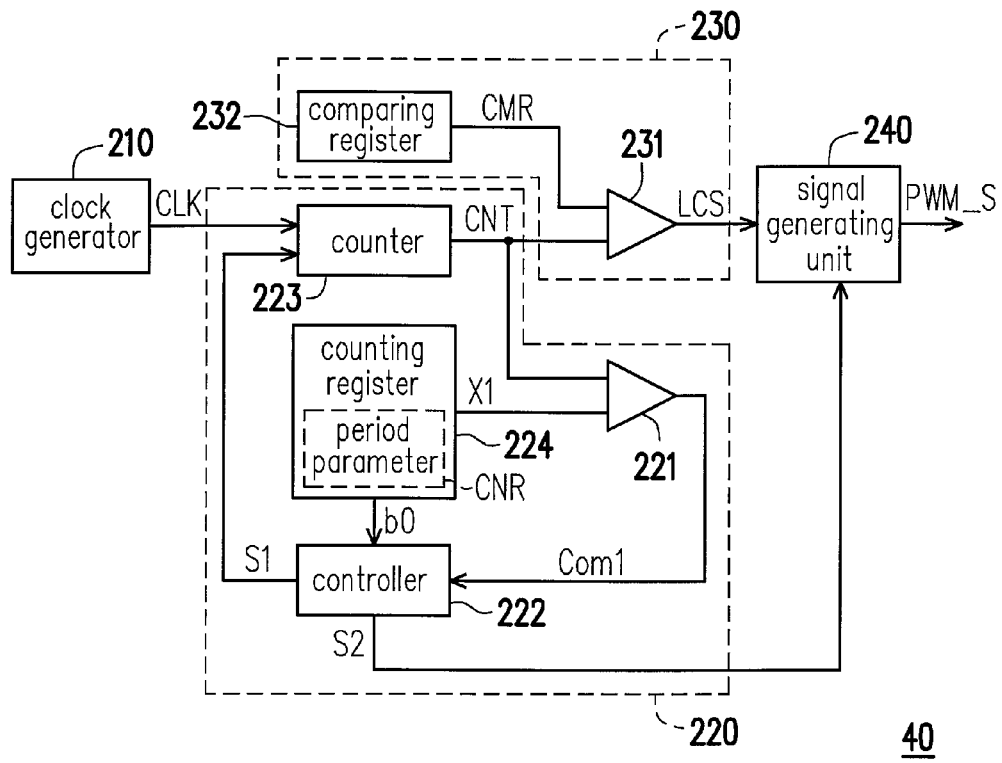
FIG. 4 is a block diagram illustrating a pulse width modulation signal generation circuit according to an embodiment of the disclosure.

More specifically, FIG. 4 is a block diagram illustrating a pulse width modulation signal generation circuit according to an embodiment of the disclosure. Referring to FIG. 4, in this embodiment, the counting unit 220 of a pulse width modulation signal circuit 40 includes a comparator 221, a controller 222, a counter 223, and a counting register 224. The comparing unit 230 of the pulse width modulation signal generation circuit 40 includes a comparator 231 and a comparing register 232.

The counter 223 is coupled to the clock generator 210 and outputs the counting value CNT in response to the clock signal CLK. The counting register 224 is coupled to the controller 222 and stores the period parameter CNR, so as to output a middle value X1 and an odd-even determining bit b0 according to the period parameter CNR. For example, it may be assumed that the counting register 224 is a 16-bit register and the period parameter CNR may be converted into a binary bit string. The bit string includes 16 bit data, which are a 0-th bit data to a 15-th bit data respectively. The counting register 224 may treat the 0-th bit data of the bit string that represents the period parameter CNR as the odd-even determining bit b0. More specifically, if the 0-th bit data in the bit string representing the period parameter CNR is "0", it is indicated that the period parameter is an even number. On the contrary, if the 0-th bit data in the bit string representing the period parameter CNR is "1", it is indicated that the period parameter CNR is an odd number. Besides, the counting register 224 may output the 15-th bit data to the first bit data in the bit string representing the period parameter CNR to the comparator 221, such that the comparator 221 may obtain the middle value X1 of the period parameter CNR.

The comparator 221 has a first input end, a second input end, and an output end. The first input end of the comparator 221 is coupled to the counter 223 to receive the counting value CNT, the second input end of the comparator 221 is coupled to the counting register 224 to receive the middle value X1, and the output end of the comparator 221 outputs a comparison result Com1. The controller 222 may receive the comparison result Com1 generated by comparing the middle value X1 and the counting value CNT and the odd-even determining bit b0 of the period parameter CNR. The controller 222 may be coupled to the counter 223, and may control the counter 223 to count up or down according to the comparison result Com1. Also, the controller 222 may determine whether the counter 223 needs to output the middle value X1 in two consecutive clock cycles or not based on the odd-even determining bit b0.

The comparing unit 230 includes the comparator 231 and the comparing register 232. The comparator 231 has a first input end, a second input end, and an output end. The first input end of the comparator 231 may be coupled to the counter 223 of the counting unit 220 to receive the counting value CNT, and the comparing register 232 may store a comparing threshold CMR and be coupled to the second input end of the comparator 231 to output the comparing threshold CMR to the second input end of the comparator 231. The comparator 231 may compare the counting value CNT and the comparing threshold CMR, and the output end of the comparator 231 may be coupled to the signal generating unit 240 to output the level control signal LCS to the signal generating unit 240.

Briefly, the controller 222 may output a control signal S1 to the counter 223 based on the comparison result Com1 and the odd-even determining bit b0. Also, the comparison result Com1 may be configured for controlling the counter 223 to count up or down, and the odd-even determining bit b0 may be configured for determining whether the counter 223 outputs the middle value in two consecutive clock cycles or not. In addition, the controller 222 of this embodiment may also output a control signal S2 to the signal generating unit 240 based on the odd-even determining bit b0, such that the signal generating unit 240 may perform a corresponding operation based on whether the period parameter CNR is odd or even. More specifically, the controller 222 may output the control signal S2 to the signal generating unit 240 based on the odd-even determining bit b0, so as to control the signal generating unit 240 to adjust the level of the pulse width modulation signal PWM_S in response to a positive edge or a negative edge of the clock signal CLK.

When the period parameter CNR of the counting register 224 is an odd number, within the signal cycle of the pulse width modulation signal PWM_S, the signal generating unit 240 may adjust the pulse width modulation signal PWM_S from the first level to the second level based on one of the positive edge and the negative edge of the clock signal CLK. Also, within the same signal cycle, the signal generating unit 240 may adjust the pulse width modulation signal from the second level to the first level according to the other one of the positive edge and the negative edge of the clock signal. Accordingly, even if the period parameter CNR is an odd number, a duty cycle of the pulse width modulation signal PWM_S may still be possible to be 50%. Here, the duty cycle of the pulse width modulation signal PWM_S is a percentage obtained by dividing the enabled period with the signal cycle. Briefly, conversion of the level of the pulse width modulation signal PWM_S may be triggered in response to both of the negative edge and the positive edge of the clock signal within the same signal cycle, such that the negative edge of the clock signal may advance or postpone a time point of triggering conversion of the level of the pulse width modulation signal PWM_S. Accordingly, the duty cycle of the pulse width modulation signal PWM_S may reach 50%.

Figure 5:
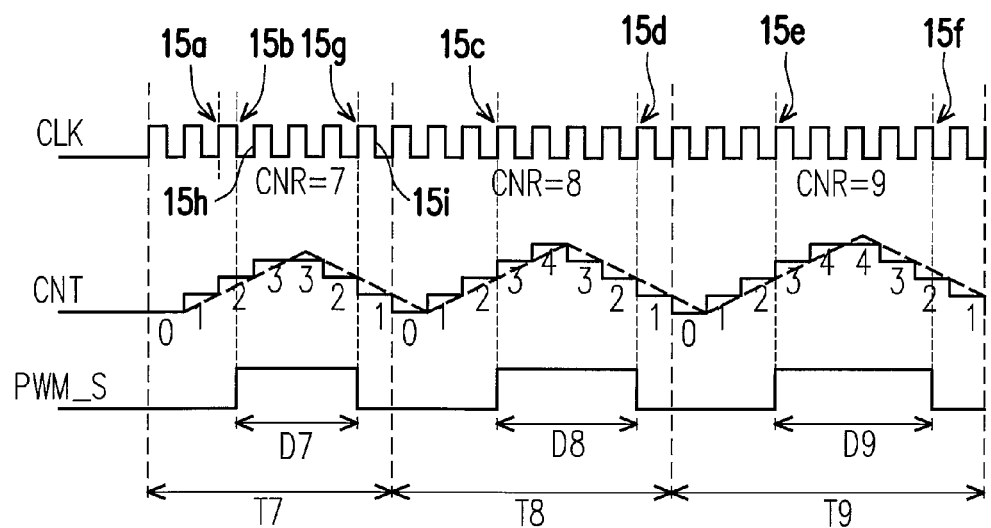
FIG. 5 is a schematic view illustrating a sequence of signals of a pulse width modulation signal generation circuit according to an embodiment of the disclosure.

FIG. 5 is a schematic view illustrating a sequence of signals of a pulse width modulation signal generation circuit according to an embodiment of the disclosure. Referring to FIGS. 4 and 5, to make the period parameter CNR equal to 7 and the duty cycle of the pulse width modulation signal PWM_S 50%, the signal generating unit 240 may advance the time point of converting the pulse width modulation signal PWM_S from the first level to the second level by triggering with a negative edge 15b of the clock signal CLK. Then, a positive edge 15g of the clock signal CLK may be used to trigger the pulse width modulation signal PWM_S to convert from the second level to the first level. Accordingly, in the example shown in FIG. 5, when the period parameter CNR is equal to 7, a second level period D7 of the pulse width modulation signal PWM_S may last for three and half clock cycles, and the signal cycle of the pulse width modulation signal PWM_S may last for seven clock cycles. Thus, even if the period parameter CNR is an odd number (CNR=7), the duty cycle of the pulse width modulation signal PWM_S may be 50%.

Besides, it can be known that when the period parameter CNR is an even number, the signal generating unit 240 may trigger conversion of the level of the pulse width modulation signal PWM_S only with the positive edge of the clock signal within one signal cycle to make the duty cycle 50%.

As shown in FIG. 5, when CNR is equal to 8, by triggering with positive edges 15c and 15d of the clock signal CLK, a second level period D8 of the pulse width modulation signal PWM_S lasts for four clock cycles, and the signal cycle of the pulse width modulation signal PWM_S lasts for eight clock cycles. The duty cycle of the pulse width modulation signal PWM_S is 50%. In another embodiment, when the period parameter is an even number, the signal generating unit 240 may also trigger conversion of the level of the pulse width modulation signal PWM_S only with the negative edge of the clock signal within one signal cycle.

As shown in FIG. 5, to achieve the period parameter equal being 9 (CNR=9) and the duty cycle of the pulse width modulation signal PWM_S being 50%, the signal generating unit 240 may trigger the pulse width modulation signal PWM_S to convert from the first level to the second level with a positive edge 15e of the clock signal CLK. Then, triggering of a negative edge 15f of the clock signal CLK may be used to advance the time point of converting the pulse width modulation signal PWM_S from the second level to the first level. Accordingly, in the example shown in FIG. 5, when the period parameter CNR is equal to 9, a second level period D9 of the pulse width modulation signal PWM_S may last for four and a half clock cycles, and the signal cycle of the pulse width modulation signal PWM_S may last for nine clock cycles. Thus, even if the period parameter CNR is an odd number (CNR=9), the duty cycle of the pulse width modulation signal PWM_S may be possible to be 50%.

In addition, when the period parameter is an odd number, even though the embodiment shown in FIG. 5 may advance the time point of converting the level of the pulse width modulation signal PWM_S by using the negative edge of the clock signal, another embodiment of the disclosure may also postpone the time point of converting the level of the pulse width modulation signal by using the negative edge of the clock signal. In the following, description will be made with the example that the period parameter CNR is equal to 7 in FIG. 5. The signal generating unit 240 may firstly convert the pulse width modulation signal PWM_S from the first level to the second level with a positive edge 15h of the clock signal CLK. Then, triggering of a negative edge 15i of the clock signal CLK may be used to postpone the time point of converting the pulse width modulation signal PWM_S from the second level to the first level. Also, in the example shown in FIG. 5, the pulse width modulation signal PWM_S is set to convert the level when the counting value is increased/decreased to become greater/lower than the comparing threshold. Thus, the embodiment shown in FIG. 5 may use the negative edge of the clock signal to advance the time point of converting the level of the pulse width modulation signal PWM_S. However, the disclosure is not limited thereto. In another embodiment, the level of the pulse width modulation signal is set to be immediately converted in response to the counting value being increased or decreased to become equal to the comparing threshold. In such embodiment, since the counting value is increased or decreased in response to triggering with the positive edge, the negative edge of the clock signal may be used to postpone the time point of converting the level of the pulse width modulation signal.

Figure 6A:
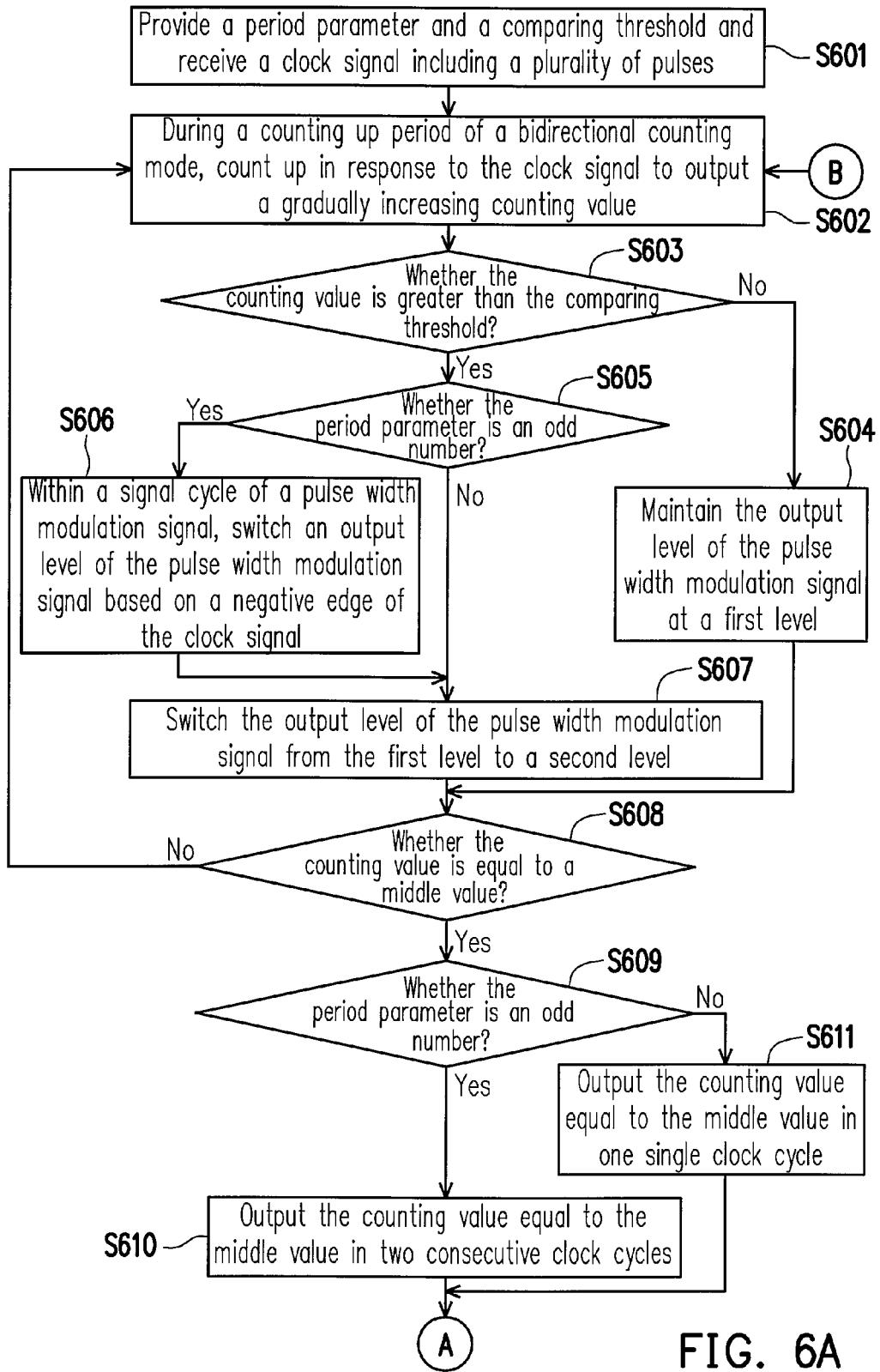
FIGS. 6A and 6B are flow charts illustrating a pulse width modulation signal generation method according to an embodiment of the disclosure.
Figure 6B:
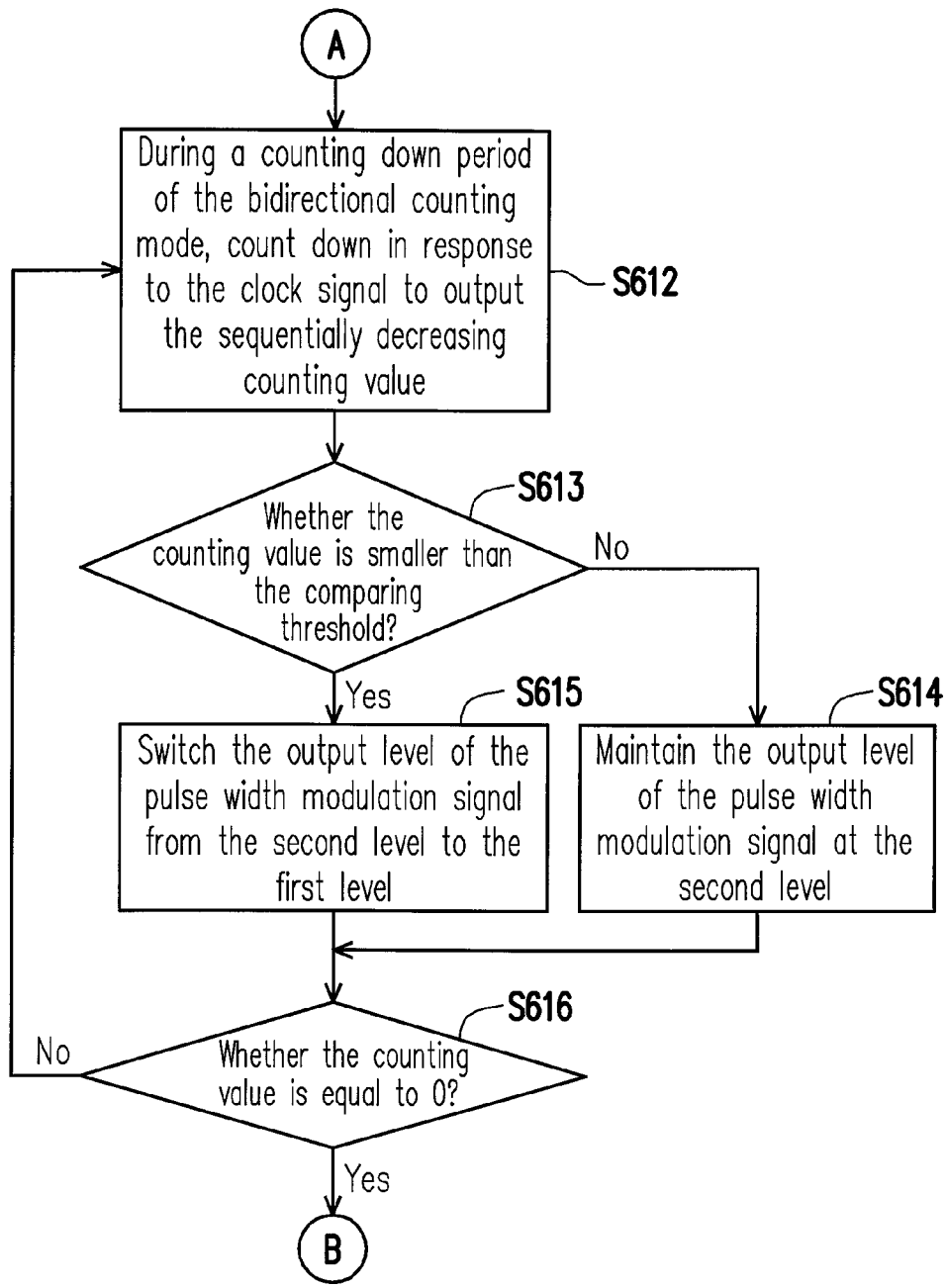

FIGS. 6A and 6B are flow charts illustrating a pulse width modulation signal generation method according to an embodiment of the disclosure. In this embodiment, the pulse width modulation signal generation method is applicable to the pulse width modulation signal generation circuit 20 or 40 shown in FIG. 2 or 4. However, the disclosure is not limited thereto.

Referring to FIG. 6A, at Step S601, the period parameter and the comparing threshold are provided, and the counting unit is used to receive the clock signal including the pulses. In other words, the period parameter and the comparing threshold may be respectively loaded to the counting unit and the comparing unit, and the counting unit receives the clock signal. The counting unit may output the counting value by counting the pulses of the clock signal based on the period parameter and the bidirectional counting mode. At Step S602, during a counting up period in the bidirectional counting mode, the counting unit counts up in response to the clock signal to output the sequentially increasing counting value.

At Step S603, whether the counting value is greater than the comparing threshold is determined by the comparing unit. If it is determined that the counting value is not greater than the comparing threshold at Step S603, the output level of the pulse width modulating signal is not changed. Thus, at Step S604, the output level of the pulse width modulation signal output by the signal generating unit may be kept at the first level. If it is determined that the counting value is greater than the comparing threshold at Step S603, at Step S605, the counting unit may determine whether the period parameter is an odd number. If yes at Step S605, the period parameter is an odd number. When the period parameter is an odd number, within the signal cycle of the pulse width modulation signal, the pulse width modulation signal may be converted from the first level to the second level based on one of the positive edge and the negative edge of the clock signal. Thus, at Step S606, within the signal cycle of the pulse width modulation signal, the output level of the pulse width modulation signal may be switched based on the negative edge of the clock signal.

It should be noted in particular that FIGS. 6A and 6B illustrate a method capable of providing a pulse width modulation signal having a duty cycle of 50%. Thus, by carrying out Steps S605 and S606, when the period parameter is an odd number, the time point of switching the level of the pulse width modulation signal may be advanced or postponed by using the negative edge of the clock signal. In this way, the duty cycle of the pulse width modulation signal is able to meet the expectation of the designer. In other words, Steps S605 and S606 may be selectively carried out based on practical needs. When the duty cycle of the pulse width modulation signal within one signal cycle meets the expected duty cycle by triggering with the positive edge or the negative edge, Steps S605 and S606 are optional. For example, in another example, when the period parameter is an even number, the pulse width modulation signal may achieve the duty cycle of 50% within one signal cycle by merely triggering with the negative edge. Thus, in embodiments where the period parameter is set to be an even number and the duty cycle is 50%, Steps S605 and S606 are optional steps. Similarly, when the period parameter is an even number, the pulse width modulation signal may achieve the duty cycle of 50% within one signal cycle merely with triggering of the positive edge.

At Step S607, the output level of the pulse width modulation signal is switched from the first level to the second level. In other words, during the counting up period of the bidirectional counting mode, when the counting value is increased to become greater than the comparing threshold, the output level of the pulse width modulation signal may be switched from the first level to the second level. At Step S608, the counting unit determines whether the counting value is equal to the middle value, so as to determine whether to stop counting up. If it is determined that the counting value is not equal to the middle value at Step S608, the flow returns to Step 602 to continue counting up in response to the clock signal. If yes at Step S608, the counting value is equal to the middle value. At Step S609, the counting unit may determine whether the period parameter is an odd number. If it is determined that the period parameter is not an odd number at Step S609, at Step S611, the counting unit may output the counting value equal to the middle value within one clock cycle. If it is determined that the period parameter is an odd number at Step 609, at Step S610, the counting unit may output the counting value equal to the middle value in two consecutive clock cycles.

Continuing to refer to FIG. 6B, at Step S612, during a counting down period in the bidirectional counting mode, counting down may be performed in response to the clock signal, so as to output the sequentially decreasing counting value. At Step S613, whether the counting value is smaller than the comparing threshold is determined by the comparing unit. If it is determined that the counting value is not smaller than the comparing threshold at Step S613, at Step S614, the output level of the pulse width modulation signal is the second level. On the contrary, if it is determined that the counting value is smaller than the comparing threshold at Step S613, at Step S615, the output value of the pulse width modulation signal may be switched from the second level to the first level based on the positive edge, for example, of the clock signal. In other words, during the counting down period, when the counting value decreases to become smaller than the comparing threshold, the output level of the pulse width modulation signal may be switched from the second level to the first level.

It should be noted in particular that FIGS. 6A and 6B illustrate a method that capable of providing a pulse width modulation signal having a duty cycle of 50%. Thus, the positive edge is adopted at Step S615 to trigger the pulse width modulation to switch from the second level to the first level in correspondence with Steps S605 and S606. However, the disclosure is not limited thereto. People having ordinary skills in the art should be able to determine whether to trigger with the positive edge or the negative edge to control switching of the pulse width modulation signal from the second level to the first level. For example, in another example, when the period parameter is an even number, the pulse width modulation signal may achieve the duty cycle of 50% within one signal cycle merely with triggering of the negative edge. Thus, the pulse width modulation signal may be switched from the first level to the second level based on triggering of the negative edge and switched from the second level to the first level based on triggering of the negative edge. In another embodiment, when the period parameter is an odd number and the duty cycle of 50% is required, the pulse width modulation signal may be switched from the first level to the second level based on triggering of the positive edge at Step S606, and switched from the second level to the first level based on triggering of the negative edge at Step S615.

At Step S616, the counting unit determines whether the counting value is equal to 0 to determine whether to stop counting down. During the counting down period in the bidirectional counting mode, counting down may be performed in response to the clock signal to output the sequentially decreasing counting value until the counting value becomes zero. The pulse width modulation signal generation method described in the embodiment shown in FIGS. 6A and 6B is sufficiently supported and taught with reference to the description of FIGS. 1 to 5. Thus, like or repeated parts are not further described below.

In view of the foregoing, the period parameter of pulse width modulation in the embodiments of the disclosure may be set as the number of pulses of the clock signal within the signal cycle of the pulse width modulation signal. When the period parameter in the embodiments of the disclosure is an odd number, the time that the counter of the pulse width modulation signal generation circuit outputs the middle value extends to two clock cycles. In this way, a resolution of pulse width modulation may be increased without increasing a clock frequency. Moreover, in some embodiments, when the period parameter is an odd number, the negative edge and the positive edge of the clock signal within the same signal cycle may be used to trigger conversion of the state of the pulse width modulation signal. The duty cycle of the pulse width modulation signal generation circuit may reach 50%. Compared with the conventional center-aligned pulse width modulation signal generation circuit, the pulse width modulation signal generation circuit according to the embodiments of the disclosure may use a lower clock frequency to reach a higher resolution, and power consumption may be further reduced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A pulse width modulation signal generation circuit, comprising:
   a clock generator, generating a clock signal comprising a plurality of pulses;
   a counting unit, coupled to the clock generator, storing a period parameter, and counting the pulses of the clock signal based on the period parameter and a bidirectional counting mode to output a counting value;
   a comparing unit, coupled to the counting unit and comparing the counting value and a comparing threshold to output a level control signal accordingly; and
   a signal generating unit, coupled to the comparing unit and generating a pulse width modulation signal based on the level control signal, wherein when the period parameter is an odd number, the counting value output by the counting unit is a middle value in two consecutive clock cycles.

2. The pulse width modulation signal generation circuit as claimed in claim 1, wherein when the period parameter is an even number, the counting value output by the counting unit is the middle value in one single clock cycle.

3. The pulse width modulation signal generation circuit as claimed in claim 1, wherein the period parameter is set as the number of pulses of the clock signal in a signal cycle of the pulse width modulation signal.

4. The pulse width modulation signal generation circuit as claimed in claim 1, wherein the middle value is a maximal integer not greater than an outcome of the period parameter divided by two.

5. The pulse width modulation signal generation circuit as claimed in claim 1, wherein when the period parameter is an odd number, the counting unit counts up in response to the clock signal to output the sequentially increasing counting value, keeps outputting the middle value for two consecutive clock cycles, and then counts down to output the sequentially decreasing counting value.

6. The pulse width modulation signal generation circuit as claimed in claim 1, wherein when the period parameter is an odd number, within one signal cycle of the pulse width modulation signal, the signal generating unit adjusts the pulse width modulation signal from a first level to a second level based on one of a positive edge and a negative edge of the clock signal, and adjusts the pulse width modulation signal from the second level to the first level based on the other one of the positive edge and the negative edge of the clock signal.

7. The pulse width modulation signal generation circuit as claimed in claim 6, wherein when the period parameter is an odd number, a duty cycle of the pulse width modulation signal is 50%.

8. The pulse width modulation signal generation circuit as claimed in claim 1, wherein the counting unit further comprises:
  a counter, coupled to the clock generator and outputting the counting value in response to the clock signal; and
  a controller, coupled to the counter, receiving a comparison result generated by comparing the middle value and the counting value and an odd-even determining bit, controlling the counter to count up or down based on the comparison result, and determining whether the counter outputs the middle value in two consecutive clock cycles based on the odd-even determining bit.

9. The pulse width modulation signal generation circuit as claimed in claim 8, wherein the counting unit further comprises:
  a counting register, coupled to the controller and storing the period parameter, so as to output the middle value and the odd-even determining bit based on the period parameter; and
  a first comparator, having a first input end, a second input end, and an output end, wherein the first input end of the first comparator is coupled to the counter to receive the counting value, the second input end of the first comparator is coupled to the counting register to receive the middle value, and the output end of the first comparator outputs the comparison result.

10. The pulse width modulation signal generation circuit as claimed in claim 8, wherein the controller outputs a control signal to the signal generating unit based on the odd-even determining bit, so as to control the signal generating unit to adjust the level of the pulse width modulation signal in response to a positive or negative edge of the clock signal.

11. The pulse width modulation signal generation circuit as claimed in claim 1, wherein the comparing unit comprises:
  a second comparator, having a first input end, a second input end, and an output end, wherein the first input end of the second comparator is coupled to the counting unit to receive the counting value, the output end of the second comparator is coupled to the signal generating unit to output the level control signal to the signal generating unit; and
  a comparing register, storing the comparing threshold and coupled to the second input end of the second comparator to output the comparing threshold to the second comparator.

12. A pulse width modulation signal generation method, comprising:
  providing a period parameter and a comparing threshold, and receiving a clock signal comprising a plurality of pulses;
  counting the clock signal based on the period parameter and a bidirectional counting mode, so as to output a counting value;
  determining whether the period parameter is an odd number or an even number;
  when the period parameter is an odd number and the counting value is increased to a middle value, outputting the counting value equal to the middle value in two consecutive clock cycles;
  comparing the counting value and the comparing threshold to determine an output level of the pulse width modulation signal, and outputting the pulse width modulation signal.

13. The pulse width modulation signal generation method as claimed in claim 12, further comprising:
  when the period parameter is an even number, outputting the counting value equal to the middle value in one single clock cycle.

14. The pulse width modulation signal generation method as claimed in claim 12, wherein the period parameter is set as the number of pulses of the clock signal in a signal cycle of the pulse width modulation signal.

15. The pulse width modulation signal generation method as claimed in claim 12, wherein the middle value is a maximal integer not greater than an outcome of the period parameter divided by two.

16. The pulse width modulation signal generation method as claimed in claim 12, wherein the step of counting the clock signal based on the period parameter and the bidirectional counting mode, so as to output the counting value, comprises:
  during a counting up period in the bidirectional counting mode, counting up in response to the clock signal to output the sequentially increasing counting value until the counting value is equal to the middle value; and
  during a counting down period in the bidirectional counting mode, counting down in response to the clock signal to output the sequentially decreasing counting value until the counting value becomes zero.

17. The pulse width modulation signal generation method as claimed in claim 12, further comprising:
  when the period parameter is an odd number, within one signal cycle of the pulse width modulation signal, adjusting the pulse width modulation signal from a first level to a second level based on one of a positive edge and a negative edge of the clock signal, and adjusting the pulse width modulation signal from the second level to the first level based on the other one of the positive edge and the negative edge of the clock signal.

18. The pulse width modulation signal generation method as claimed in claim 17, wherein when the period parameter is an odd number, a duty cycle of the pulse width modulation signal is 50%.

19. The pulse width modulation signal generation method as claimed in claim 12, wherein the step of comparing the counting value and the comparing threshold to determine the output level of the pulse width modulation signal comprises:
  when the counting value gradually is increased to the comparing threshold, switching the output level of the pulse width modulation signal from a first level to a second level; and when the counting value gradually decreases to the comparing threshold, switching the output level of the pulse width modulation signal from the second level to the first level.

20. A pulse width modulation signal generation circuit, comprising:
- a clock generator, generating a clock signal comprising a plurality of pulses;
- a counting unit, coupled to the clock generator, storing a period parameter, and counting the pulses of the clock signal based on the period parameter to output a counting value;
- a comparing unit, coupled to the counting unit and comparing the counting value and a comparing threshold to output a level control signal accordingly; and
- a signal generating unit, coupled to the comparing unit and generating a pulse width modulation signal based on the level control signal,
- wherein the period parameter is set as the number of pulses of the clock signal in a signal cycle of the pulse width modulation signal.

\* \* \* \* \*